(12) United States Patent
Huang et al.

(10) Patent No.: US 7,705,367 B2
(45) Date of Patent: Apr. 27, 2010

(54) PINNED PHOTODIODE SENSOR WITH GATE-CONTROLLED SILICON-CONTROLLED RECTIFIER TRANSFER SWITCH AND METHOD OF FORMATION

(75) Inventors: Chien-Chang Huang, Hsin-Chu Hsien (TW); Chih-Cheng Hsieh, Hsin-Chu Hsien (TW); Ching-Wei Chen, Hsin-Chu Hsien (TW)

(73) Assignee: PixArt Imaging Inc., Hsin-Chu Hsien (TW)

( * ) Notice: Subject to any disclaimer, the term of this patent is extended or adjusted under 35 U.S.C. 154(b) by 55 days.

(21) Appl. No.: 11/381,744

(22) Filed: May 4, 2006

(65) Prior Publication Data
US 2006/0249764 A1 Nov. 9, 2006

(30) Foreign Application Priority Data
May 5, 2005 (TW) .................. 94114550 A

(51) Int. Cl.
H01L 29/423 (2006.01)

(52) U.S. Cl. .............. 257/113; 257/128; 257/E29.057; 257/E29.181

(58) Field of Classification Search .................. 257/113, 257/124, 128, 292, E29.057, E29.181
See application file for complete search history.

(56) References Cited

U.S. PATENT DOCUMENTS

| 5,600,160 | A | * | 2/1997 | Hvistendahl | ................. 257/288 |
| 5,625,210 | A |   | 4/1997 | Lee et al. | |
| 5,705,835 | A | * | 1/1998 | Nishiura et al. | ............. 257/147 |
| 5,821,572 | A | * | 10/1998 | Walker et al. | ................. 257/107 |
| 5,841,159 | A |   | 11/1998 | Lee et al. | |
| 5,880,495 | A |   | 3/1999 | Chen | |
| 5,903,021 | A |   | 5/1999 | Lee et al. | |
| 5,904,493 | A |   | 5/1999 | Lee et al. | |
| 6,027,955 | A |   | 2/2000 | Lee et al. | |
| 6,051,447 | A |   | 4/2000 | Lee et al. | |
| 6,100,551 | A |   | 8/2000 | Lee et al. | |
| 6,274,910 | B1 | * | 8/2001 | Yu | .............................. 257/355 |
| 6,297,070 | B1 |   | 10/2001 | Lee et al. | |
| 6,320,617 | B1 |   | 11/2001 | Gee et al. | |
| 6,372,537 | B1 |   | 4/2002 | Lee et al. | |
| 6,469,332 | B1 |   | 10/2002 | Berezin | |

(Continued)

FOREIGN PATENT DOCUMENTS
TW 415104 B 12/2000

(Continued)

Primary Examiner—Minh-Loan T Tran
Assistant Examiner—W. Wendy Kuo
(74) Attorney, Agent, or Firm—Winston Hsu

(57) ABSTRACT

A pinned photodiode sensor with gate-controlled SCR switch includes a pinned photodiode and a gate-controlled SCR switch. The SCR switch includes a P-type substrate, an N− doped region, and an N+ doped region formed on the substrate; a P+ doped region formed on the N− doped region; an oxide layer formed on the P substrate, the N− doped region, the N+ doped region, and the P+ doped region; and a gate formed above the P substrate and the N− doped region. The gate includes a P+ doped region and an N+ doped region. During an exposure procedure, a depletion region will not reach the interface between the oxide layer and the substrate, thereby preventing dark current leakage.

13 Claims, 13 Drawing Sheets

U.S. PATENT DOCUMENTS

| | | | |
|---|---|---|---|
| 6,521,952 B1 * | 2/2003 | Ker et al. | 257/360 |
| 6,531,725 B2 | 3/2003 | Lee et al. | |
| 6,660,553 B2 * | 12/2003 | Kimura et al. | 438/48 |
| 6,677,628 B2 | 1/2004 | Berezin | |
| 6,767,770 B1 * | 7/2004 | Horch et al. | 438/133 |
| 2002/0163009 A1 * | 11/2002 | Ker et al. | 257/107 |
| 2002/0171097 A1 * | 11/2002 | Chen et al. | 257/292 |
| 2003/0122149 A1 * | 7/2003 | Sakano et al. | 257/107 |
| 2004/0155257 A1 * | 8/2004 | Yashita | 257/107 |
| 2004/0157356 A1 * | 8/2004 | Mouli et al. | 438/60 |
| 2005/0274988 A1 * | 12/2005 | Hong | 257/225 |

FOREIGN PATENT DOCUMENTS

| | | |
|---|---|---|
| TW | 437108 B | 5/2001 |
| TW | 471174 B | 1/2002 |

* cited by examiner

PINNED PHOTODIODE SENSOR WITH GATE-CONTROLLED SILICON-CONTROLLED RECTIFIER TRANSFER SWITCH AND METHOD OF FORMATION

BACKGROUND OF THE INVENTION

1. Field of the Invention

The present invention relates to a pinned photodiode sensor with gate-controlled silicon-controlled rectifier (SCR) transfer switch, and more particularly, to a gate-controlled SCR transfer switch with a gate having different doped regions.

2. Description of the Prior Art

In the prior art, there is a process of integrating a pinned photodiode into an active pixel sensor. Please refer to FIG. 1, which is a diagram of a pinned photodiode integrated into an active pixel sensor according to the prior art. There are a P+ doped region 12, an N− doped region 14, an N+ doped region 16, an oxide layer 17, and a gate 18 formed on a P-type substrate 10. The process related to the structure of FIG. 1 has advantages of better blue response, and low dark current.

Since there are plenty of interface traps between the oxide layer 17 and the substrate 10, such interface traps release or capture electrons or holes with changes of temperature or electric field intensity, resulting in dark current leakage. When the oxide layer 17 contacts the P+ doped region 12, the P-type substrate 10, or the N− doped region 14, the region contacting the oxide layer 17 can provide electrons or holes to prevent a depletion region from touching interface traps of surface interfaces to generate dark current. However, the structure of FIG. 1 cannot completely prevent dark current leakage during operation.

Please refer to FIG. 2, which is a diagram of entering an exposure procedure after resetting the pinned photodiode of FIG. 1. When resetting the pinned photodiode, the gate 18 is connected to a high voltage so as to generate a depletion region 13 (between dotted line 5 and dotted line 7) between the P-type substrate 10 and the N− doped region 14 and a depletion region 19 (between dotted line 7 and dotted line 9) between the P+ doped region 12 and the N− doped region 14. The depletion regions 13 and 19 reach the interfaces (shown as a circle 15 in FIG. 2), and interface traps might release or capture electrons or holes, leading to dark current leakage and noise when the active pixel sensor captures images.

SUMMARY OF THE INVENTION

The claimed invention discloses a gate-controlled SCR transfer switch. The gate-controlled SCR transfer switch comprises a substrate; a first doped region formed on the substrate; a second doped region formed on the substrate; a third doped region formed on the first doped region; a dielectric layer formed on the substrate, the first doped region, the second doped region, and the third doped region; and a gate formed on the dielectric layer. The gate comprises a P+ doped region and an N+ doped region. A doping concentration of the second doped region is greater than a doping concentration of the first doped region. The third doped region and the first doped region are formed by opposite types of materials.

These and other objectives of the present invention will no doubt become obvious to those of ordinary skill in the art after reading the following detailed description of the preferred embodiment that is illustrated in the various figures and drawings.

DETAILED DESCRIPTION

The present invention provides an SCR transfer switch with a gate having different doped regions to prevent dark current leakage.

First, to shed light on a fabrication process of the SCR transfer switch of the present invention, please refer to FIG. 3 to FIG. 8, which show steps of forming the SCR transfer switch of the present invention.

Figure 3:
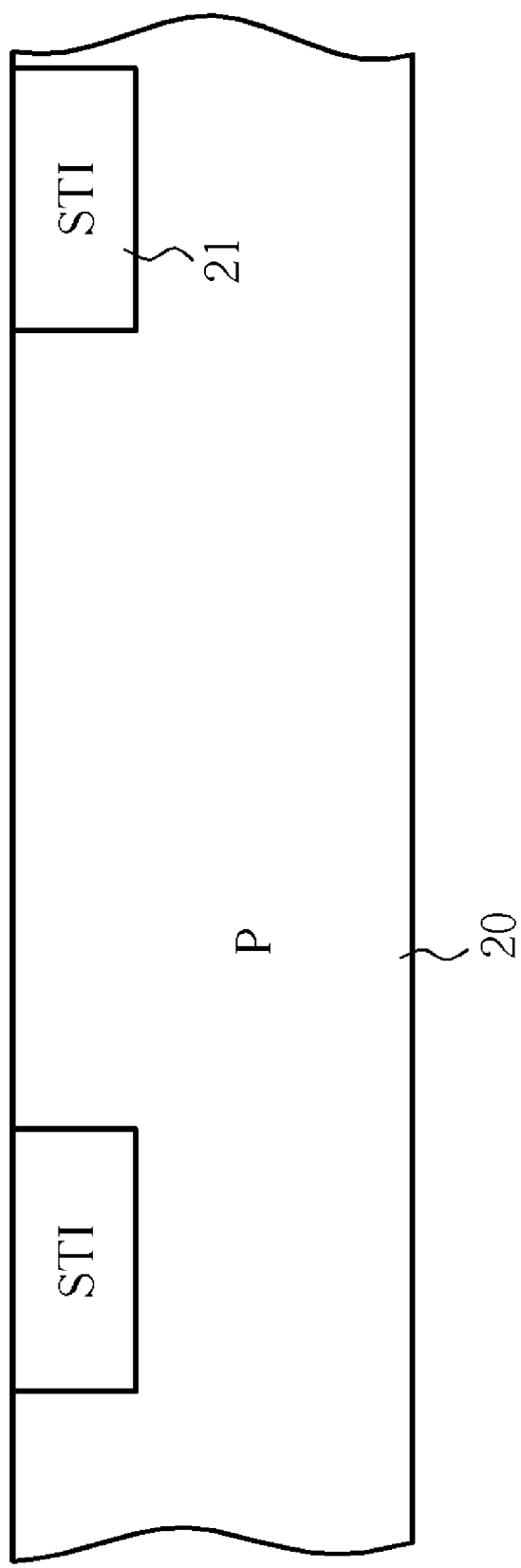
FIG. 3 to FIG. 8 are steps of forming an SCR transfer switch of the present invention.
Figure 4:
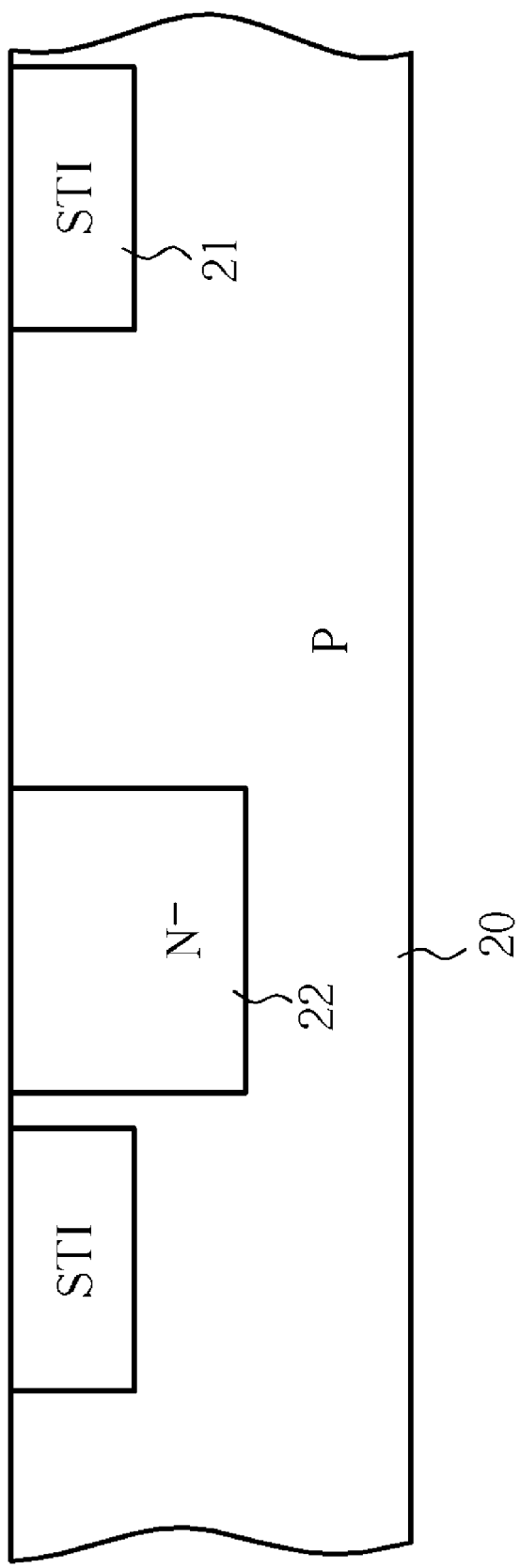
Figure 5:
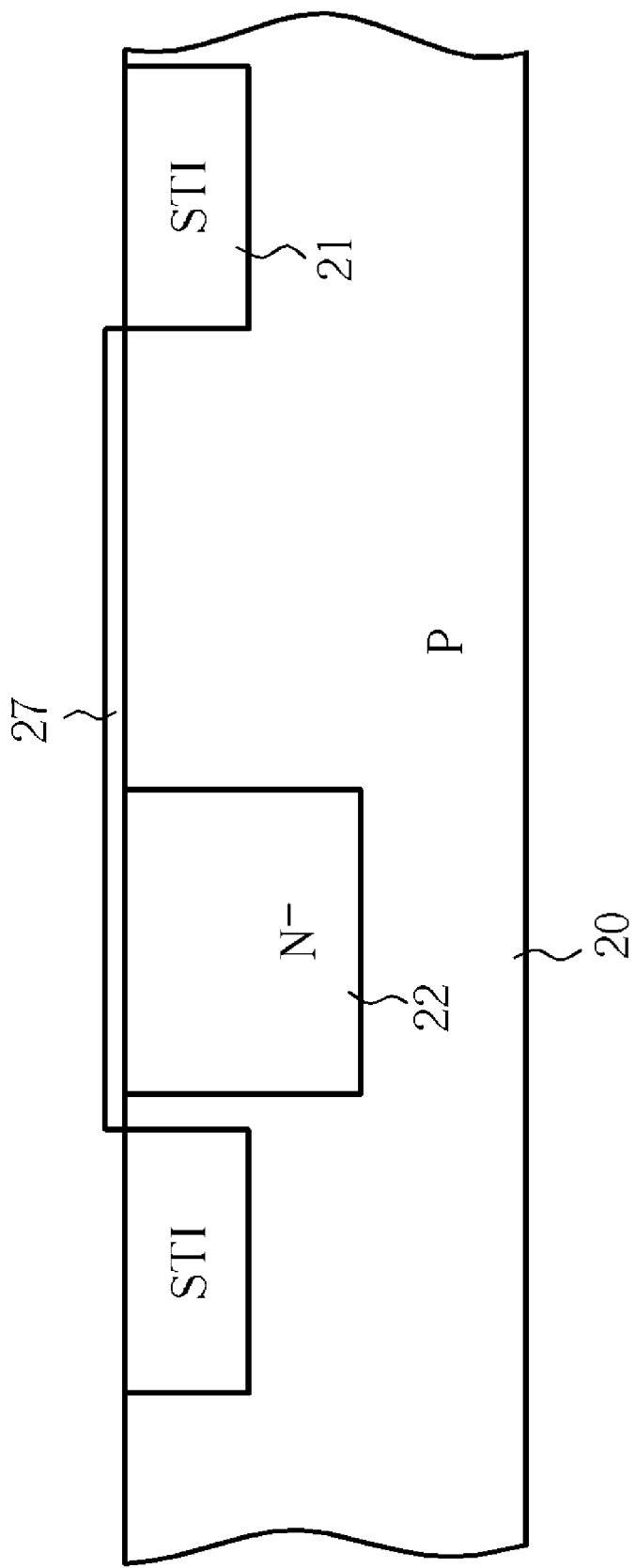
Figure 6:
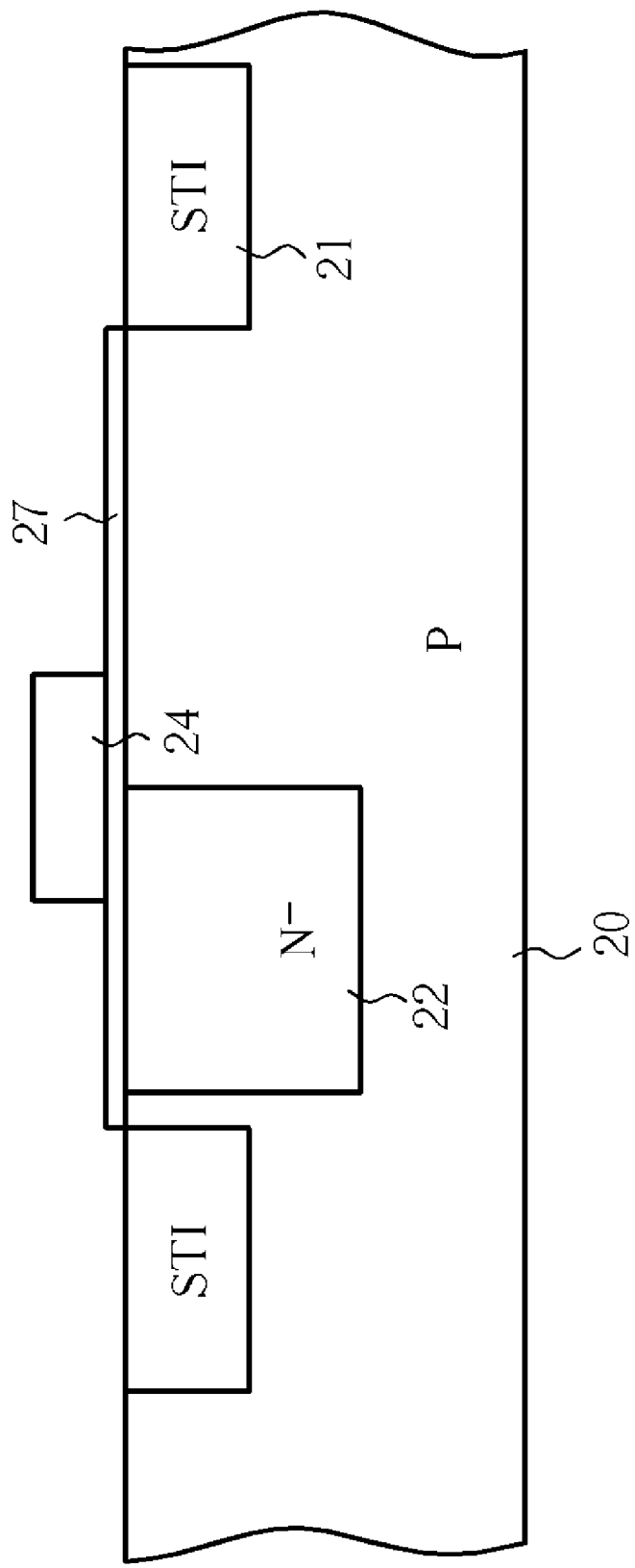
Figure 7:
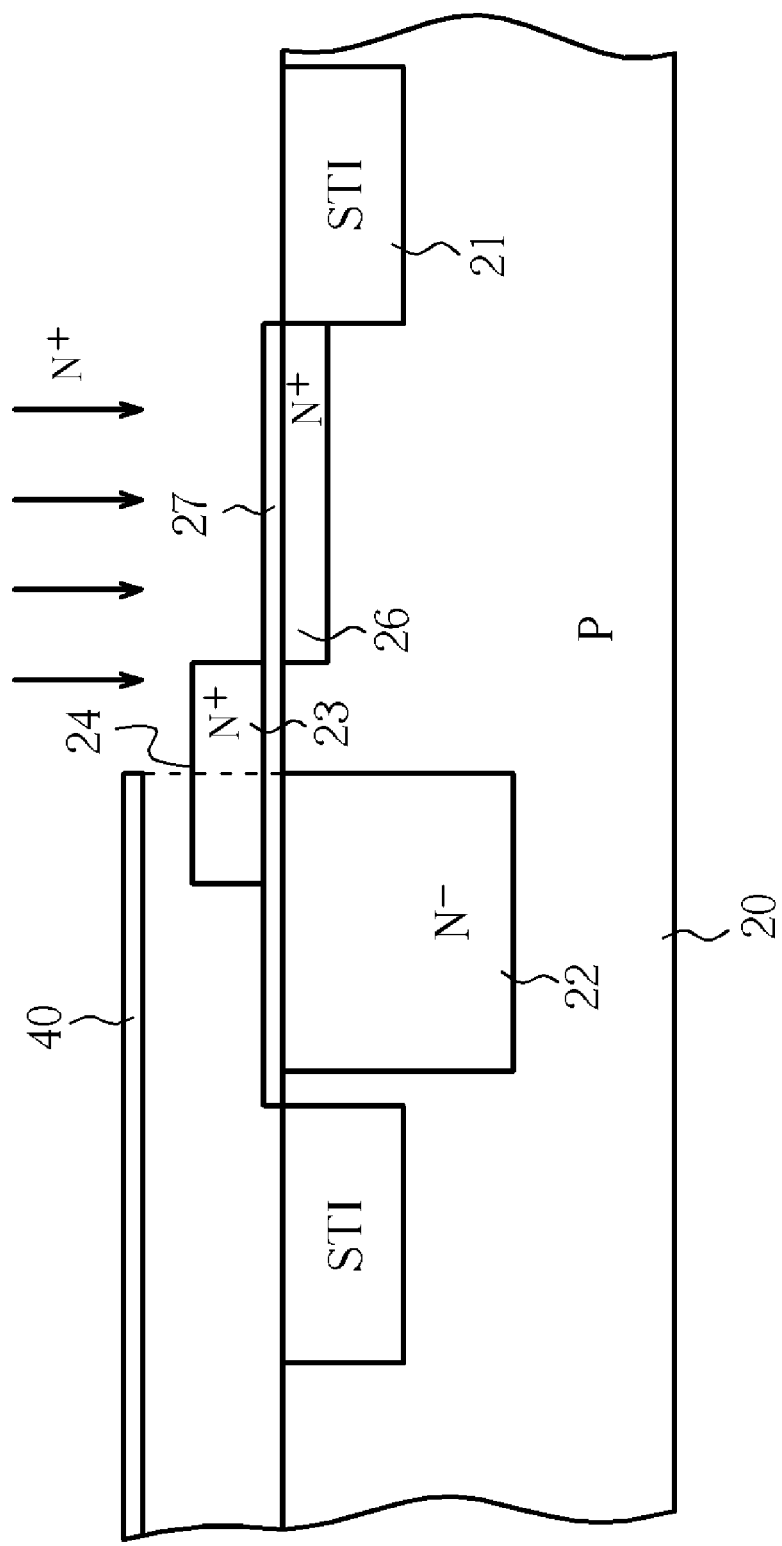
Figure 8:
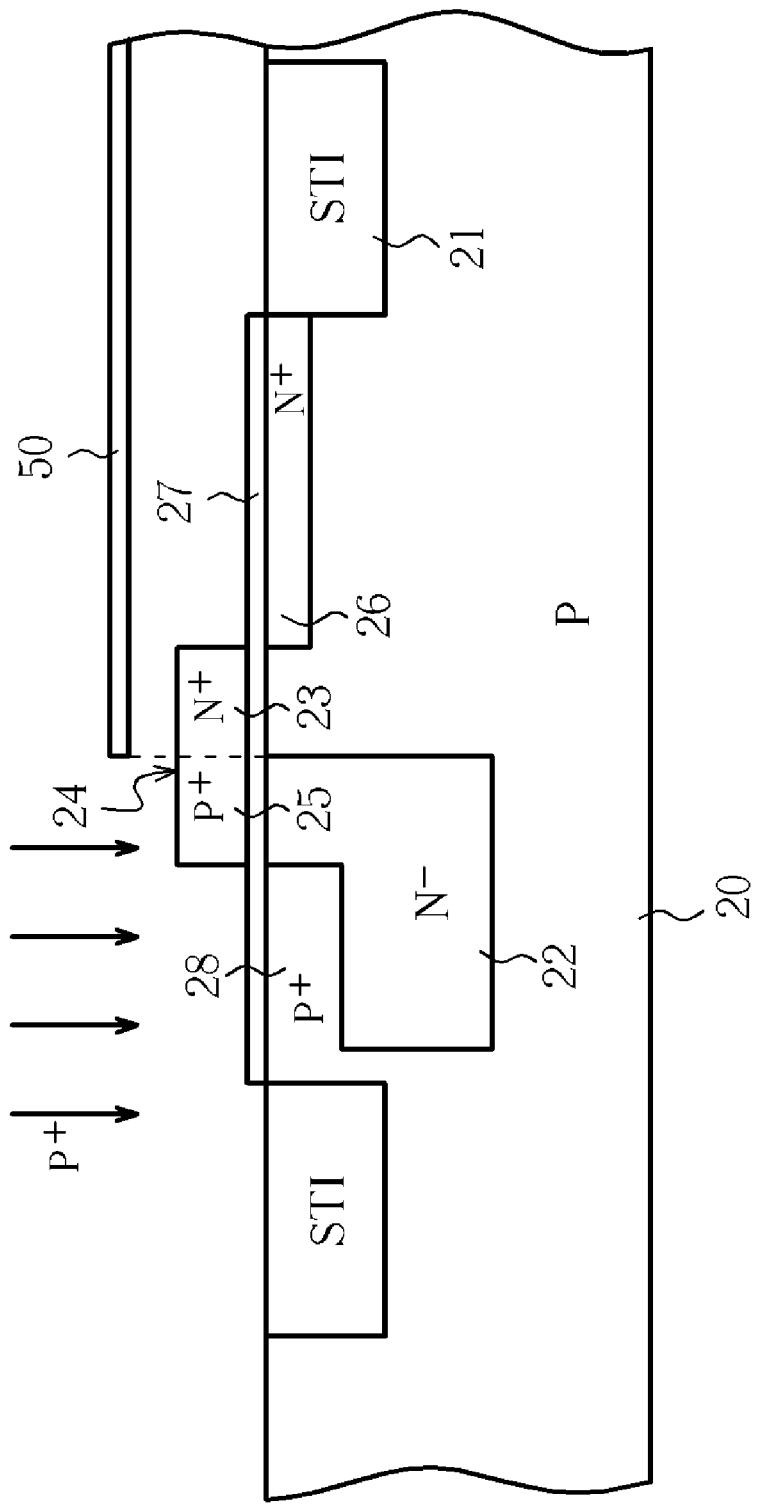

Please refer to FIG. 3. A shallow trench isolation (STI) 21 is formed on a P-type substrate 20 for isolating each element. The STI 21 can be replaced with a field oxide layer. Next, an N− doped region (a first doped region) 22 is formed on the P-type substrate 20, as shown in FIG. 4. Then, an oxide layer 27, which can be made of SiO2, is formed, as shown in FIG. 5. As shown in FIG. 6, a gate 24 is formed on the oxide layer 27 above the N− doped region 22 and the P-type substrate 20. In FIG. 7, a mask 40 covers the entire N− doped region 22 and a part of the gate 24 above the N− doped region 22, and N+ ions are implanted into the uncovered regions to form an N+ doped region (a second doped region) 26 and an N+ doped region 23 of the gate 24. Finally, a mask 50 covers the N+ doped region 23 and the N+ doped region 26, and P+ ions are implanted into the uncovered regions to form a P+ doped region (a third doped region) 28 and a P+ doped region 25 of the gate 24. The above is not intended to limit the sequence of each step. For instance, the step of FIG. 8 can be performed before the step of FIG. 7.

Figure 1:
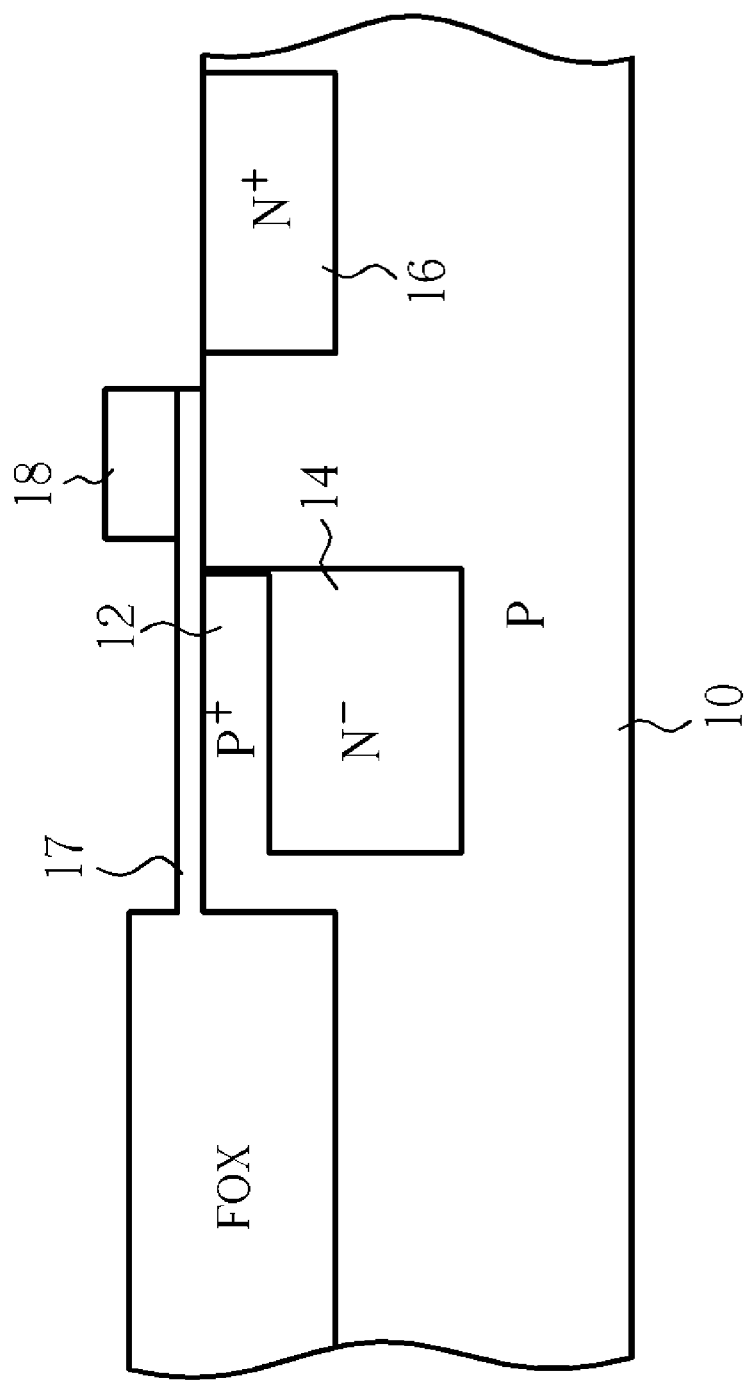
FIG. 1 is a diagram of a pinned photodiode integrated into an active pixel sensor according to the prior art.
Figure 2:
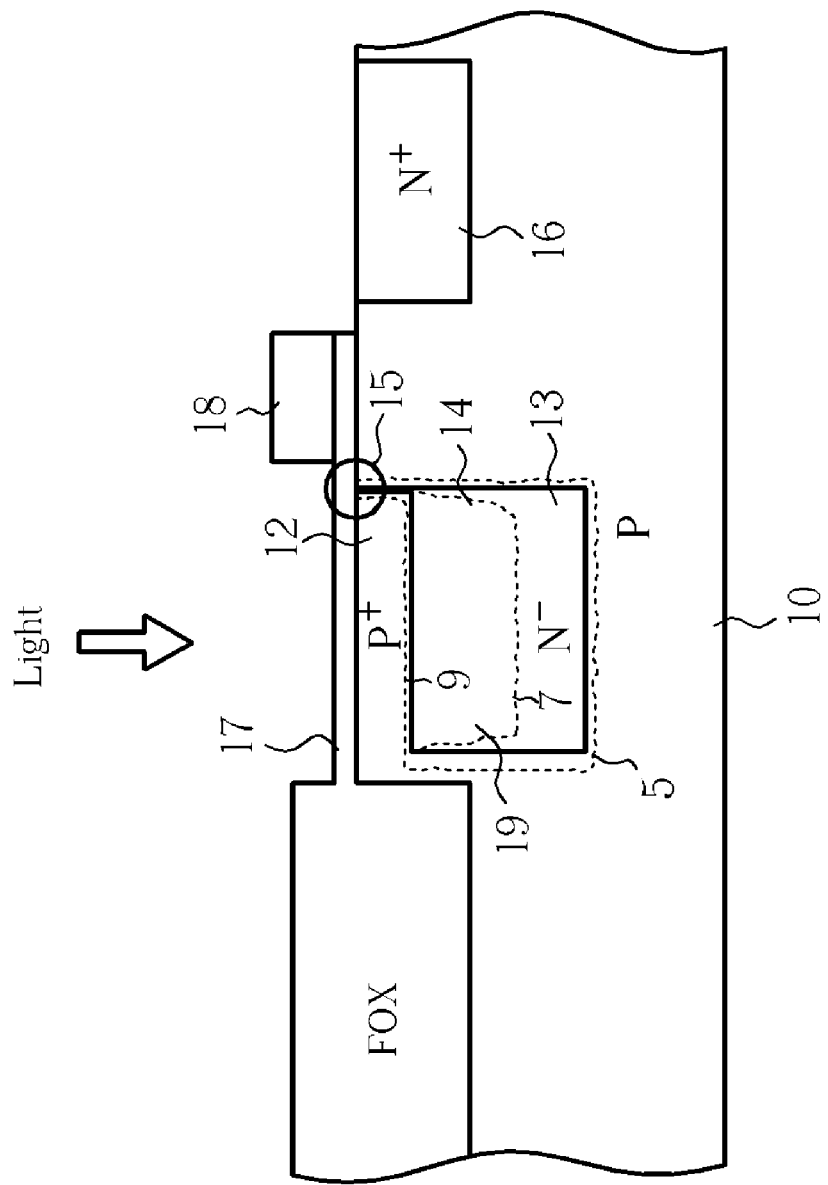
FIG. 2 is a diagram of entering an exposure procedure after resetting the pinned photodiode of FIG. 1.
Figure 9:
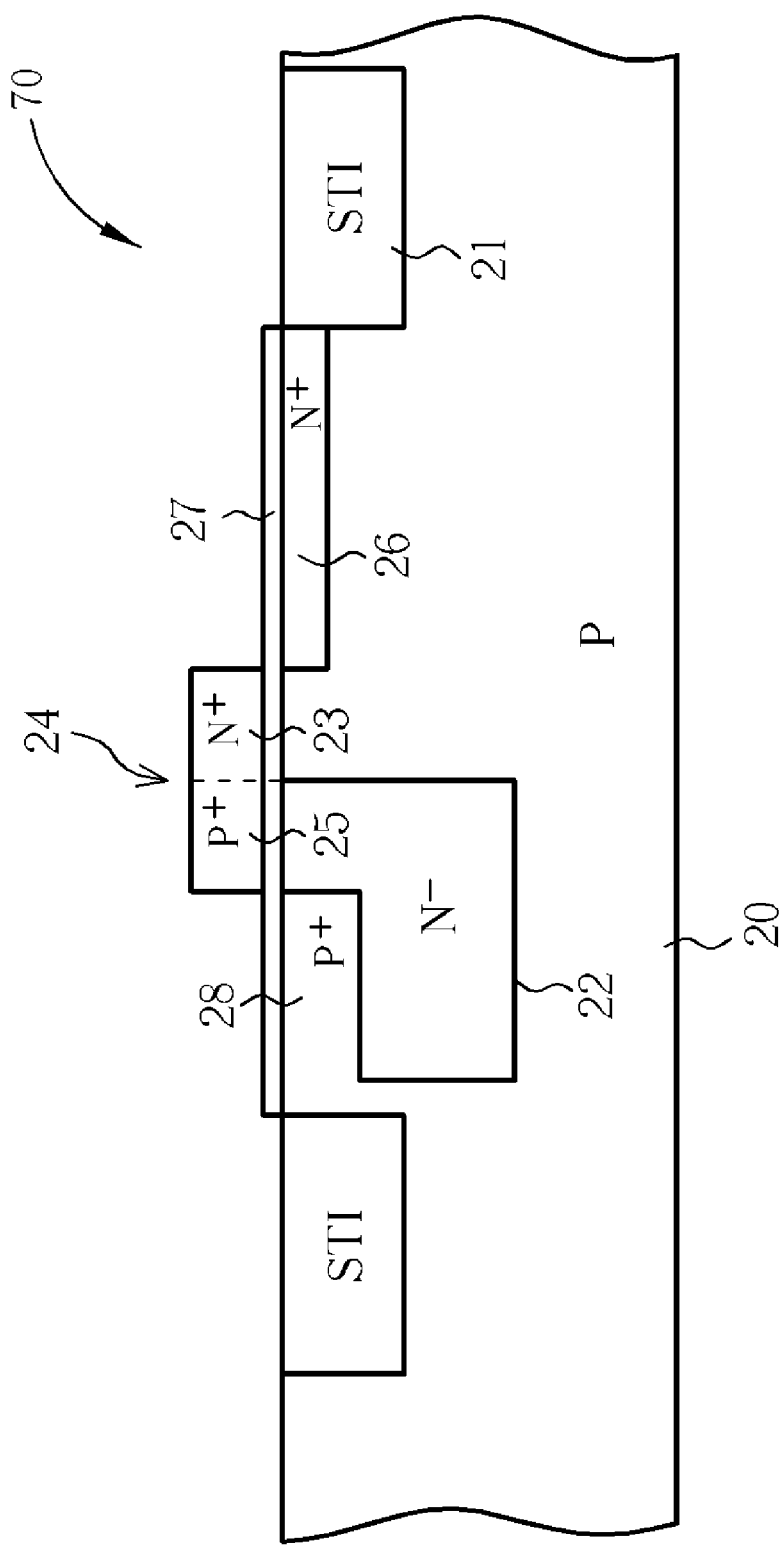
FIG. 9 is a diagram of the SCR transfer switch with the gate having different doped regions based on the present invention.

After steps of FIG. 3 to FIG. 8, the SCR transfer switch is completely made, as shown in FIG. 9, which is a diagram of the SCR transfer switch 70 with the gate 24 having different doped regions based on the present invention. Noted that the SCR transfer switch 70 of FIG. 9 differs from the structure of FIG. 1. Firstly, the gate 24 of the SCR transfer switch 70 comprises the N+ doped region 23 and the P+ doped region 25, which is not characterized in the prior art. Secondly, there are two opposite types of electrical conductive materials under the gate 24. That is, a part of the N− doped region 22 is under the gate 24 and a part of the P-type substrate 20 is also under the gate 24. However, the prior art only has the P-type substrate 10 under the gate 18, or only has one type of electrically conductive material under the gate 18. Additionally, the boundary between the N+ doped region 23 and the P+ doped region 25 of the gate 24 is approximately corresponding to the boundary between the N– doped region 22 and the P-type substrate 20.

The above embodiment adopts the P-type substrate 20. The present invention can also use an N-type substrate, and then materials of all doped regions are changed correspondingly.

Figure 10:
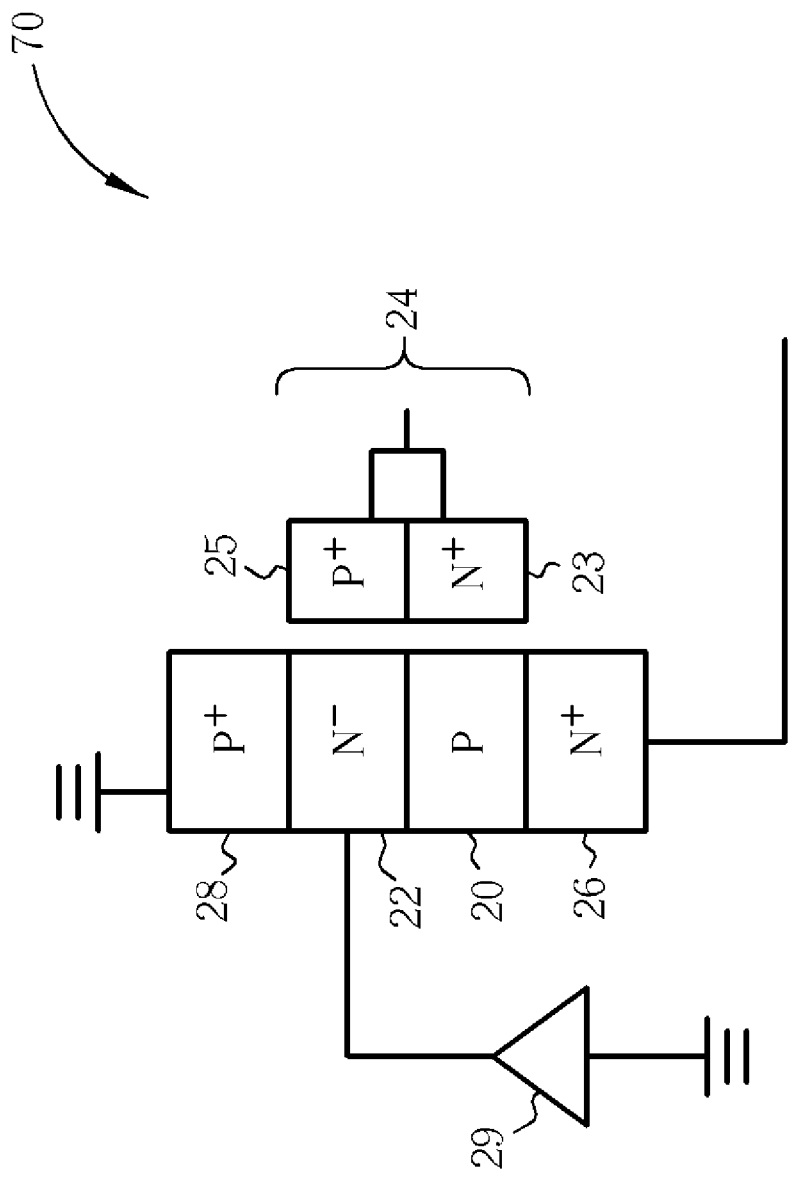
FIG. 10 is a circuit equivalent to the SCR transfer switch of FIG. 9.

Please refer to FIG. 10, which is a circuit equivalent to the SCR transfer switch 70 of FIG. 9. A pinned photodiode 29 of FIG. 10 is parasitized between the N– doped region 22 and the P-type substrate 20, and between the N– doped region 22 and the P+ doped region 28 of the SCR transfer switch 70 of FIG. 9 for receiving light. The N+ doped region 26 is regarded as a drain of the SCR transfer switch 70 of FIG. 9.

Figure 11:
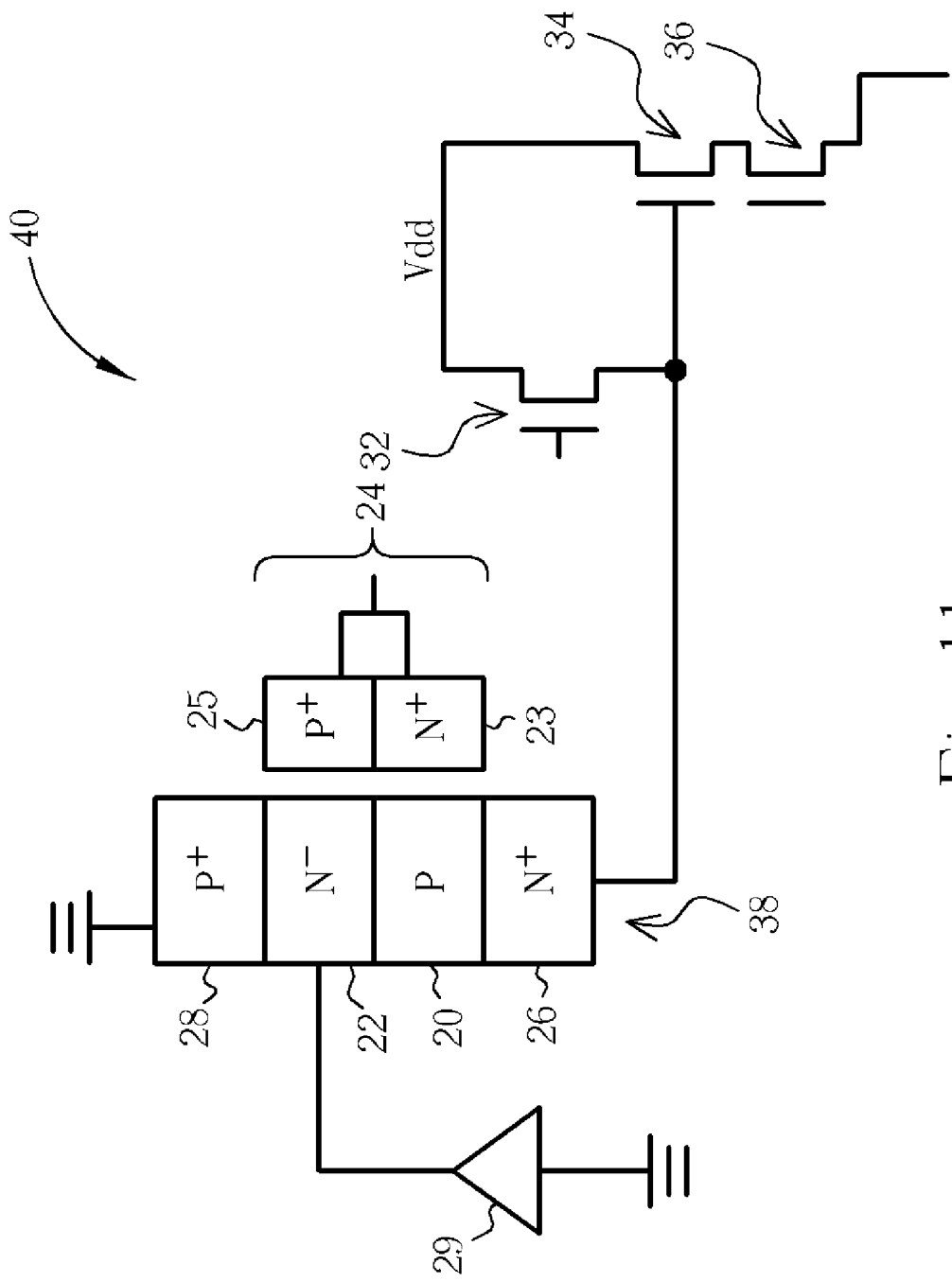
FIG. 11 is a diagram of the SCR transfer switch implemented in an active pixel sensor.

Please refer to FIG. 11, which is a diagram of the SCR transfer switch 70 implemented in an active pixel sensor 40. In addition to the SCR transfer switch 70, the active pixel sensor 40 further comprises a reset transistor (a first transistor) 32, a source-follower transistor (a second transistor) 34 and a row-selector transistor (a third transistor) 36. For simplified explanation, the SCR transfer switch 70 is divided into a sub-SCR transfer switch 38 and the pinned photodiode 29.

The following is a simple description of each element. The photodiode 29 receives light, the sub-SCR transfer switch 38 controls transfer of photoelectric charge of the photodiode 29, the reset transistor 32 resets the photodiode 29, the voltage of a source of the source-follower transistor 34 changes with the charge received by a gate of the source-follower transistor 34, and the row-selector transistor 36 controls read out of a light signal or a reset signal.

Figure 12:
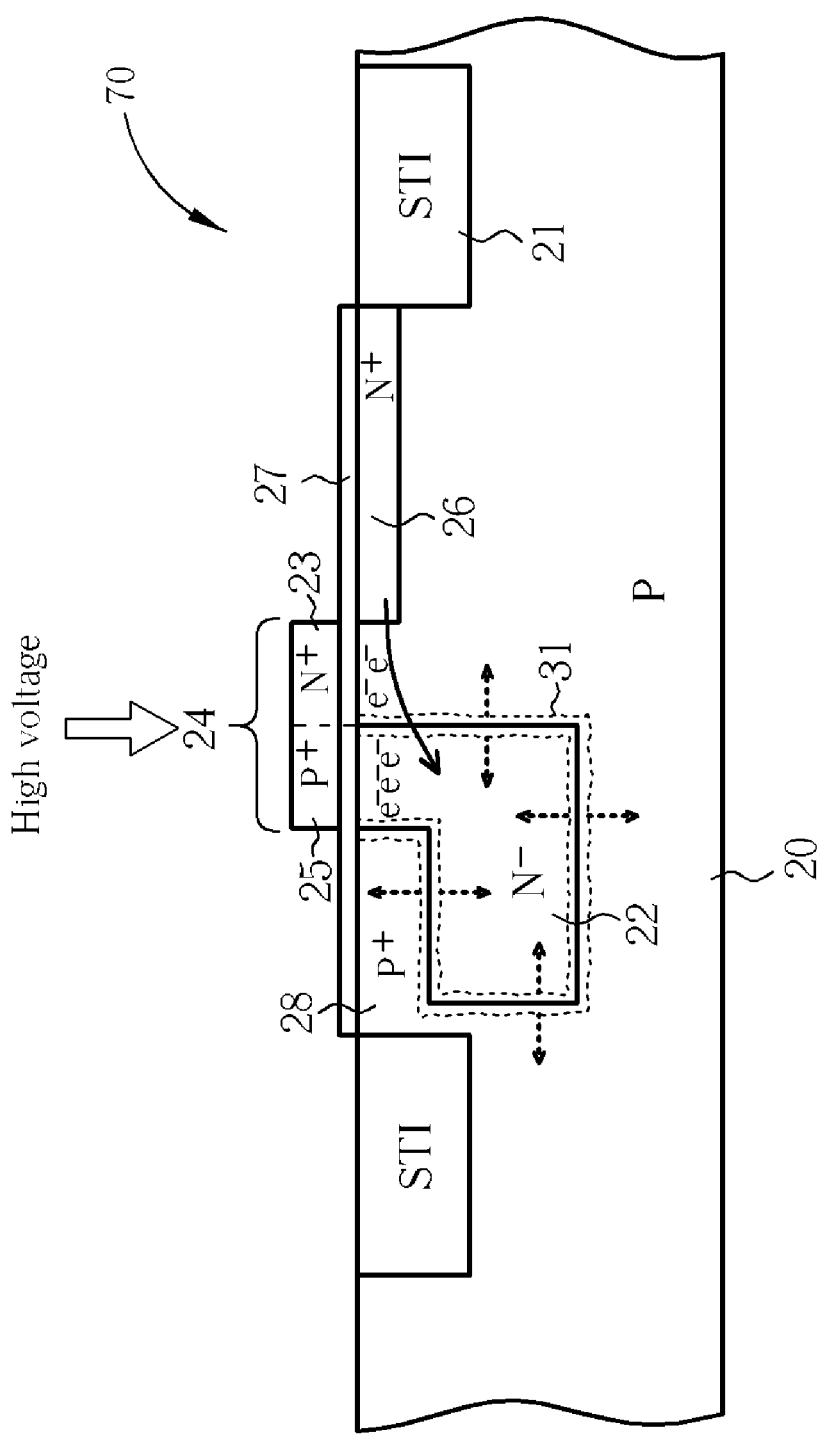
FIG. 12 shows the condition of the SCR transfer switch of FIG. 9 under a reset mode.
Figure 13:
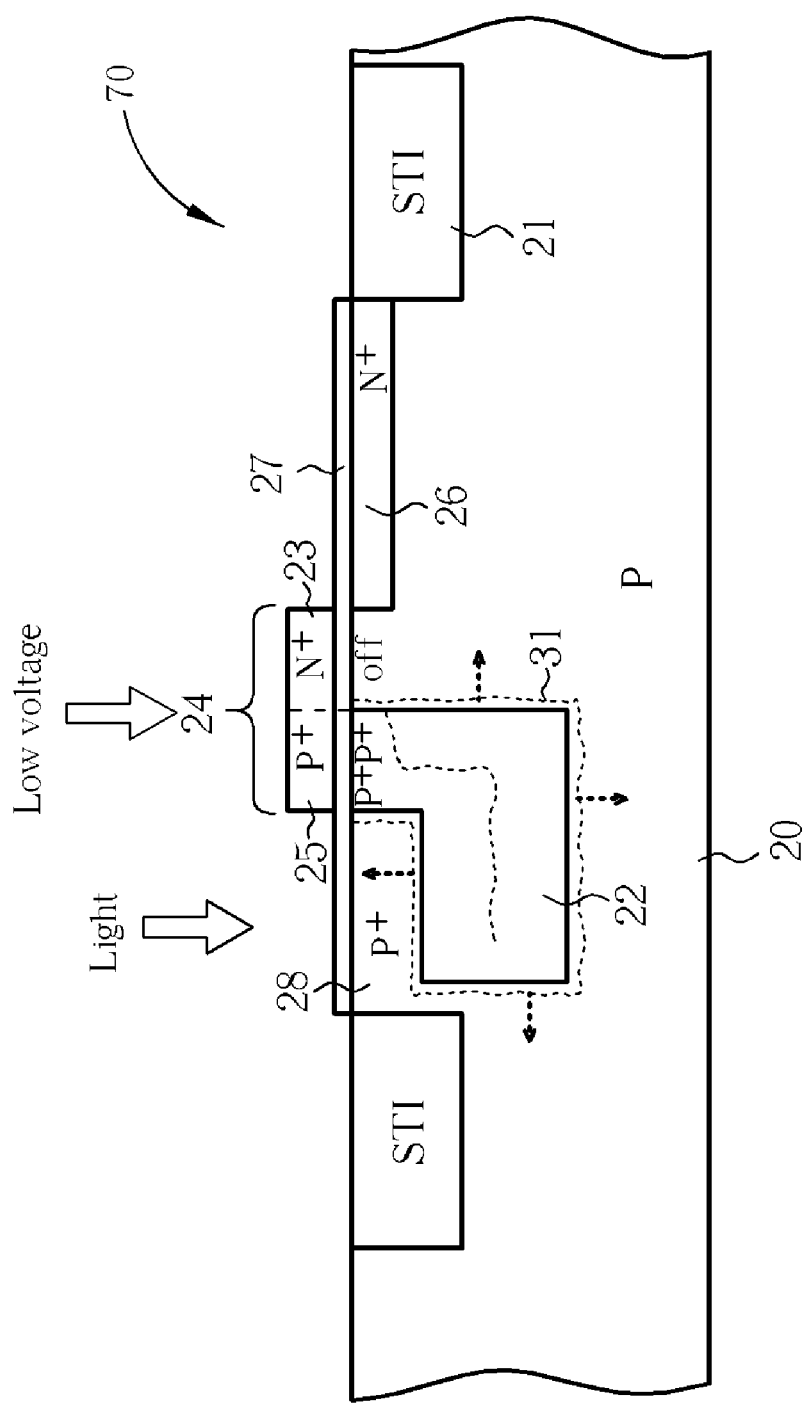
FIG. 13 shows the condition of the SCR transfer switch of FIG. 9 under an exposure mode.

Before capturing images, the active pixel sensor 40 has to reset the pinned photodiode 29 via the reset transistor 32, including applying a high voltage at a gate of the reset transistor 32 and the gate 24 of the sub-SCR transfer switch 38 to turn on the reset transistor 32 and the sub-SCR transfer switch 38 and to turn off the row-selector transistor 36. Please refer to FIG. 12, which shows the condition of the SCR transfer switch 70 of FIG. 9 under a reset mode. Since a high voltage is applied to the gate 24, an electron channel e- is formed under the gate 24, such that a reset voltage of the N+ doped region 26 is transmitted to the pinned photodiode 29 through the electron channel e- to reset the pinned photodiode 29. After the reset voltage is transmitted from the N+ doped region 26 to the N– doped region 22, a depletion region 31 (see the dotted lines) is formed between the N– doped region 22 and the P+ doped region 28, and between the N– doped region 22 and the P-type substrate 20. FIG. 12 shows an initial status when the SCR transfer switch 70 is under the reset mode. The width of the depletion region 31 is gradually increased in the directions the dotted arrows indicate until the "walls" of the depletion region 31 merge (as shown in FIG. 13). After that, the reset voltage cannot be transmitted to the pinned photodiode 29 through the electron channel e-, completing the reset mode.

Please refer to FIG. 13, which shows the condition of the SCR transfer switch 70 of FIG. 9 under an exposure mode. FIG. 13 shows a final status when the SCR transfer switch 70 is under the reset mode, and also an initial status under the exposure mode. When the exposure mode is performed, a low voltage (or zero voltage) is applied to the gate 24 to turn off the sub-SCR transfer switch 38. There is no electron channel e- formed in the P-type substrate 20 under the gate 24; that is, the channel between the N+ doped region 26 and the N–doped region 22 is cut off. However, a hole channel P+ is formed in the N– doped region 22 under the gate 24. The hole channel P+ has a greater concentration and is formed at the surface of the N– doped region 22 near the oxide layer 27, and thereby the depletion region 31 cannot reach the interface between the oxide layer 27 and the P-type substrate 20 to prevent dark current leakage. Next, the width of the depletion region 31 is decreased according the received light. In other words, the pinned diode 29 receives light to change the width of the depletion region 31.

The present invention provides a better method to prevent dark current leakage when the active pixel sensor operates. Two opposite types of electrically conductive materials are implanted into the gate of the SCR transfer switch, and there are two opposite types of electrically conductive materials under the gate. With the process of the present invention, the depletion region does not reach the interface between the oxide layer and the substrate when the active pixel sensor is under the exposure mode, so that dark current leakage can be prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A gate-controlled silicon-controlled rectifier (SCR) transfer switch comprising:
   a substrate;
   a first doped region formed on the substrate;
   a second doped region formed on the substrate, a doping concentration of the second doped region being greater than a doping concentration of the first doped region;
   a third doped region formed on the first doped region, the third doped region and the first doped region being formed by opposite types of materials;
   a dielectric layer formed on the substrate, the first doped region, the second doped region, and the third doped region; and
   a gate formed on the dielectric layer, the gate comprising a P+ doped region and an N+ doped region, wherein the P+ doped region of the gate overlaps the first doped region while the N+ doped region of the gate does not overlap the first doped region, and the N+ doped region of the gate overlaps a portion of the substrate.

2. The gate-controlled SCR transfer switch of claim 1, wherein a part of the first doped region is beneath the P+ doped region of the gate.

3. The gate-controlled SCR transfer switch of claim 2 further comprising a P-type channel formed between the first doped region and the P+ doped region of the gate when providing a low voltage to the gate.

4. The gate-controlled SCR transfer switch of claim 1, wherein the substrate is a P-type substrate.

5. The gate-controlled SCR transfer switch of claim 1, wherein the first doped region is an N– doped region, the second doped region is an N+ doped region, and the third doped region is a P+ doped region.

6. The gate-controlled SCR transfer switch of claim 1, wherein the dielectric layer is an oxide layer.

7. An active pixel comprising:
   an SCR transfer switch comprising:
      a substrate;
      a first doped region formed on the substrate;
      a second doped region formed on the substrate, a doping concentration of the second doped region being greater than a doping concentration of the first doped region;

a third doped region formed on the first doped region, the third doped region and the first doped region being formed by opposite types of materials;
a dielectric layer formed on the substrate, the first doped region and the third doped region; and
a gate formed on the dielectric layer, the gate comprising a P+ doped region and an N+ doped region, wherein the P+ doped region of the gate overlaps the first doped region while the N+ doped region of the gate does not overlap the first doped region, and the N+ doped region of the gate overlaps a portion of the substrate
a first transistor having a source connected to the second doped region of the SCR transfer switch, and a drain connected to a voltage source, the first transistor resetting the SCR transfer switch;
a second transistor having a drain connected to the voltage source, and a gate connected to the source of the first transistor; and
a third transistor having a drain connected to a source of the second transistor, and a source connected to a pixel line, the third transistor controlling to output a signal.

8. The active pixel of claim 7, wherein a part of the first doped region of the SCR transfer switch is formed beneath the P+ doped region of the gate.

9. The active pixel of claim 8, wherein during an exposure procedure, the SCR transfer switch further comprises a P-type channel formed between the first doped region and the dielectric layer for preventing dark current leakage.

10. The active pixel of claim 7, wherein the substrate of the SCR transfer switch is a P-type substrate.

11. The active pixel of claim 7, wherein the first doped region is an N− doped region, the second doped region is an N+ doped region, and the third doped region is a P+ doped region.

12. The active pixel of claim 7, wherein the first transistor, the second transistor, and the third transistor are NMOS transistors.

13. The active pixel of claim 7, wherein the dielectric layer of the SCR transfer switch is an oxide layer.

* * * * *